United States Patent [19]
Gordon

[11] Patent Number: 5,932,848
[45] Date of Patent: Aug. 3, 1999

[54] LOW PROFILE ELECTRONIC WEIGHING APPARATUS

[75] Inventor: Arnold S. Gordon, Woodmere, N.Y.

[73] Assignee: Circuits and Systems, Inc., East Rockaway, N.Y.

[21] Appl. No.: 09/244,738

[22] Filed: Feb. 5, 1999

Related U.S. Application Data

[63] Continuation of application No. 08/862,940, May 30, 1997, Pat. No. 5,869,788.

[51] Int. Cl.$^6$ .............................. G01G 3/14; G01G 21/22
[52] U.S. Cl. ...................... 177/210 R; 177/253; 177/263
[58] Field of Search ................................... 177/126, 180, 177/238, 239, 240, 241, 243, 210 R, 134, 136, 211, 229, 253, 262, 179

[56] References Cited

U.S. PATENT DOCUMENTS

| | | | |
|---|---|---|---|
| 3,266,584 | 8/1966 | Lee | 177/253 |
| 4,396,079 | 8/1983 | Brendel | 177/180 |
| 4,453,606 | 6/1984 | Mokhbery et al. | 177/134 |
| 4,884,645 | 12/1989 | Knothe et al. | 177/180 |
| 4,886,133 | 12/1989 | Horn et al. | 177/211 |
| 4,957,177 | 9/1990 | Hamilton et al. | 177/211 |
| 4,979,581 | 12/1990 | Kroll | 177/134 |
| 5,183,125 | 2/1993 | Schurr | 177/229 |

*Primary Examiner*—Randy W. Gibson
*Attorney, Agent, or Firm*—David P. Gordon; David S. Jacobson; Thomas A. Gallagher

[57] ABSTRACT

An electronic weighing device includes a lower base plate, an upper load bearing plate, and a load cell coupled to central portions of the upper and lower plates such that the load cell responds to weight on the bearing plate. The upper and lower plates are each notched at a central location, with the notches being offset from each other. The overlapping portions of the notches form a cavity for a central portion of the load cell, The load cell is tapered or reduced in height at opposite ends thereof so that its ends fit between a notched portion of one of the upper and lower plates and a full-thickness portion of the other of the upper and lower plates. The reduced height ends of the load cell are coupled to the upper and lower plates.

12 Claims, 3 Drawing Sheets

LOW PROFILE ELECTRONIC WEIGHING APPARATUS

This application is a continuation of U.S. Ser. No. 08/862,940, now issued as U.S. Pat. No. 5,869,788.

BACKGROUND OF THE INVENTION

1. Field of the Invention

The invention relates to electronic weighing devices. More particularly, the invention relates to an electronic weighing device having a very low profile. The low profile weighing device is described with reference to a shielded embodiment to prevent EMI/RFI emission and to provide EMI/RFI immunity, although it is not limited thereto.

2. State of the Art

Electronic weighing devices are widely known in the art and there are many different technologies utilized in these electronic weighing devices. Generally, the electronic weighing technologies utilize a transducer of some type which generates an electrical signal which is proportional to the weight being measured. Most electronic weighing devices use load cell technology. In load cell scales, the applied weight compresses an elastic member which has strain gauges bonded to its surface. The strain gauge is a fine wire or etched foil which undergoes a change in electrical resistance when it is either stretched or compressed. A measurement of this change in resistance yields a measure of the applied weight. Regardless of the technology used, all electronic scales rely on some type of circuit to convert the electrical signal generated by the transducer to a signal which can be used to operated a weight display.

All electronic circuits generate a certain amount of electromagnetic (EM) radiation or radio frequency (RF) radiation and all electronic devices can be adversely affected by this type of radiation. Undesirable radiation of this type is referred to as noise or interference. Thus, the terms EMI and RFI refer to electromagnetic interference and radio frequency interference. EMI and RFI can be classified in three categories: atmospheric noise, galactic noise, and man-made noise. Atmospheric noise is generally the result of thunderstorms and lightening discharges. Sensitive electronic equipment can be affected by a thunderstorm more than one thousand miles away. Galactic noise which reaches earth is primarily the result of solar activity such as sun spots and sun flares. Solar storms can severely affect sensitive electronic equipment. The most preponderant source of EMI and RFI, however, is man-made noise. Every electrical device, including a simple light bulb, is capable of generating a certain amount of noise. Given the ever increasing proliferation of electrical devices throughout the world, man-made EMI and RFI has now been recognized as a serious environmental problem which can adversely affect the operation of all electronic devices.

Society now relies greatly on the accurate function of electronic devices. A malfunction in an electronic device can result in economic loss, can cause a health hazard, or can damage property. For this reason, various industrial standards committees and governmental agencies have adopted specifications for permissible levels of EMI and RFI. These specifications apply to many different electronic devices and provide for EMI and RFI emissions as well as immunity. The emissions specification indicates the maximum permissible amount of interference an electrical device may generate and the immunity specification indicates the amount of ambient interference that an electrical device must tolerate while continuing to function accurately.

There are many situations in which electronic weighing devices should or must comply with EMI and RFI emissions and immunity specifications. Generally, whenever an electronic weighing device is used in the vicinity of other electrical equipment, the emissions and immunity specifications should apply. In some of these situations, interference generated by the electronic weighing device can cause nearby devices to malfunction. For example, in a laboratory where many sensitive electronic devices may be near an electronic weighing device, emissions from the electronic weighing device must be controlled. In other situations, interference generated by nearby devices can cause an electronic weighing device to become unreliable. For example, there are situations where an electronic weighing device is used to constantly monitor the contents of a liquid or gas cylinder. The output of the weighing device is used to determine when the cylinder is near empty, or to determine the rate at which the liquid or gas is dispensed. Ambient RF or EM interference can cause errors in these determinations. Such errors can be costly and/or hazardous. Electronic weighing devices are commonly used in the semiconductor manufacturing industry to monitor gases used in the manufacturing process. An error in monitoring these gases can result in damage to many thousands of dollars worth of semiconductors. Moreover, electronic weighing devices can be used to monitor liquids and gases used in medicine or in environmental control. An error in monitoring these fluids can be hazardous or fatal.

Shielding an electronic weighing device for RFI and EMI is challenging. The weighing devices have moving parts which must not be inhibited and the circuits used in the weighing devices must be accessible to adjust the zero setting and sensitivity of the electronic weighing device. In addition, shielding could add considerable height to the weighing device. This would be undesirable in many applications where it is preferred or required that the weighing device have a low profile.

SUMMARY OF THE INVENTION

It is therefore an object of the invention to provide an electronic weighing device having a low profile.

It is an additional object of the invention to provide an electronic weighing device which is shielded to prevent EMI/RFI emission and to provide EMI/RFI immunity.

It is also an object of the invention to provide an electronic weighing device with EMI/RFI shielding which does not interfere with moving parts of the electronic weighing device.

It is another object of the invention to provide an electronic weighing device with EMI/RFI shielding which does not interfere with access to the circuits used in the electronic weighing device.

It is a further object of the invention to provide an electronic weighing device with EMI/RFI shielding which is easy to manufacture.

In accord with these objects which will be discussed in detail below, the electronic weighing device of the present invention includes a lower base plate, an upper load bearing plate, and a load cell coupled to central portions of the upper and lower plates such that the load cell responds to weight on the bearing plate. In order to reduce the profile of the weighing device, the upper and lower plates are each notched, preferably at a central location, to form a cavity for a central portion of the load cell. In addition, the load cell is preferably tapered or reduced in height at opposite ends thereof so that its ends fit between a notched portion of one of the upper and lower plates and a full-thickness portion of the other of the upper and lower plates. The reduced height ends of the load cell are coupled to the upper and lower plates.

In the preferred embodiment, the lower and upper base plates are electrically conductive, and a flexible conductive band coupling the periphery of the upper plate to the periphery of the lower plate is provided. An electronic circuit is electrically coupled to the load cell. The circuit is provided on a board which is mechanically mounted on the lower plate close to its center. A pair of grooves or bores are provided in the lower plate extending from the circuit board to a peripheral edge of the lower plate. A pair of non-conductive rods are coupled to adjustment potentiometers on the circuit board. The non-conductive rods extend through the grooves or bores from the circuit board to the peripheral edge of the lower plate. A peripheral portion of the lower plate is provided with a shielded electrical socket which is coupled by shielded cable to the circuit on the circuit board.

As provided, the electronic weighing device according to the invention therefore constitutes a conductive envelope which substantially completely encloses the load cell and associated circuitry. The conductive band is preferably a rolling band which does not interfere with the movement of the upper plate relative to the lower plate, yet provides an RF/EM shield around the space between the plates. The bores (or grooves) and the non-conductive rods allow access to circuit adjustments without significantly affecting the integrity of the shielding. Locating the load cells and the circuit close to the centers of the plates minimizes the impact of the bores (or grooves) on the integrity of the shielding.

According to a presently preferred aspect of the invention, the conductive rolling band is formed with metallic cloth tape which is applied to the outer edges of the upper and lower plates in an sideways-$\Omega$-shaped configuration. In addition, an electrically conductive cover is preferably provided and attached to the top surface of the top plate with four sides extending down adjacent to the rolling band. The cover is preferably electrically coupled to the top plate with a conductive adhesive and forms an additional RF/EM shield around the space between the plates.

Additional objects and advantages of the invention will become apparent to those skilled in the art upon reference to the detailed description taken in conjunction with the provided figures.

DETAILED DESCRIPTION OF THE PREFERRED EMBODIMENTS

Figure 1:
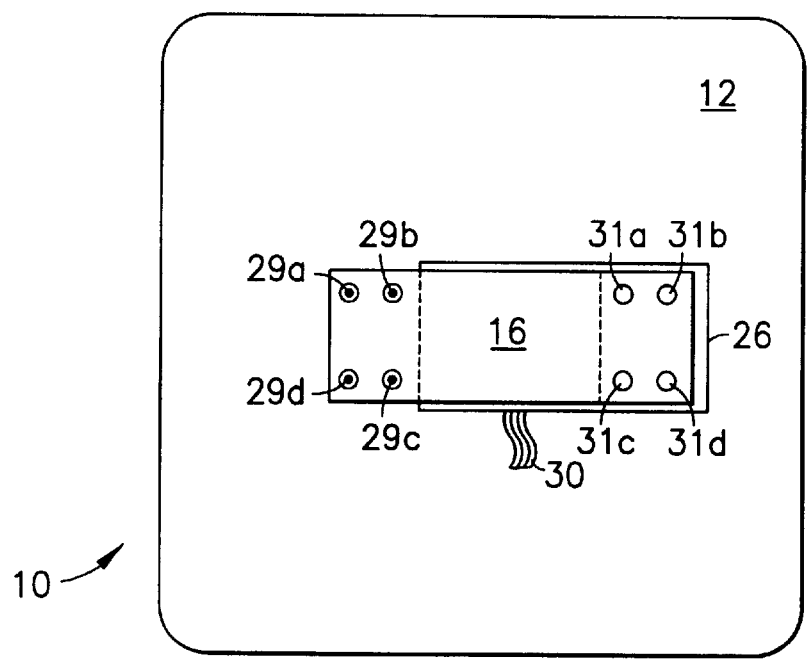
FIG. 1 is a plan view of the underside of a bearing plate of a weighing device according to the invention.
Figure 2:
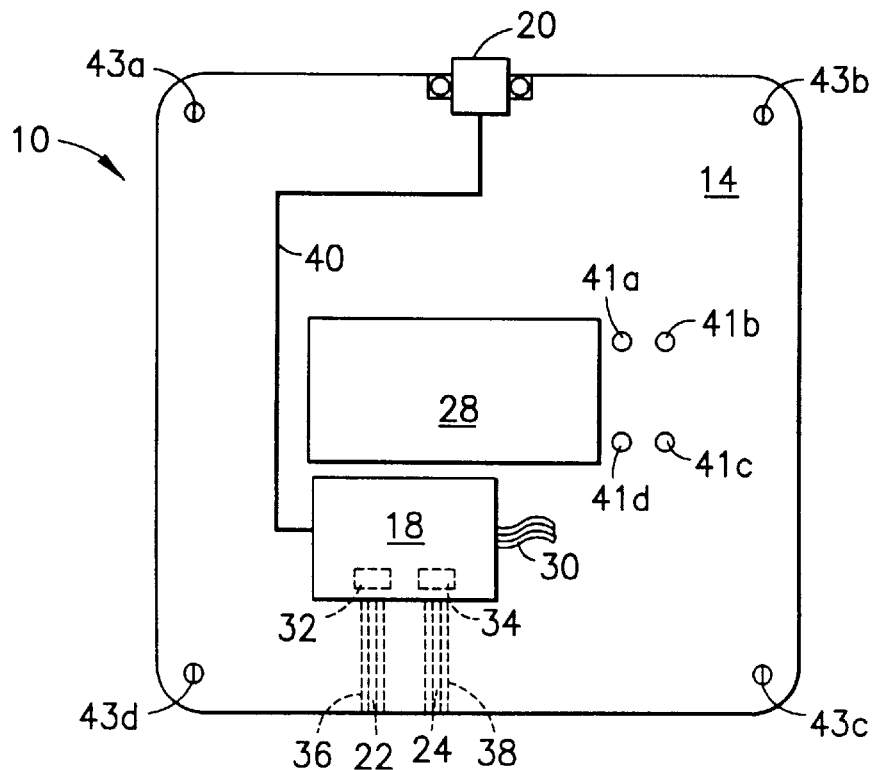
FIG. 2 is a plan view of the top side of a base plate of a weighing device according to the invention.

Referring now to FIGS. 1 and 2, an electronic weighing device 10 includes an upper electrically conductive load bearing plate 12, a lower electrically conductive base plate 14, a load cell 16, a circuit board 18, a shielded socket 20, and two plastic rods 22, 24. As described in more detail with reference to FIG. 4, the upper load bearing plate 12 is provided with a centrally located rectangular recess 26 for receiving an upper portion of the load cell 16 and the lower base plate 14 is provided with a similar recess 28 for receiving a lower portion of the load cell 16. The load cell 16 is mechanically coupled to the upper plate 12 by four hex head screws 29a–29d which engage four threaded holes, two of which (33c, 33d) are shown in FIG. 4, which are located on one side of the recess 26. The load cell 16 is electrically coupled to the circuit board 18 by a flexible cable 30. The load cell 16 is also provided with four threaded holes 31a–31d for mechanically coupling it to the base plate 14 as described in more detail below with reference to FIGS. 3 and 4.

The circuit board 18 is mounted to the lower base plate 14 adjacent to the lower recess 28 by screws (not shown). The circuit board includes two adjustment potentiometers 32, 34 which provide a zeroing and span functions and the plate 14 is provided with a recess (not shown) for receiving the potentiometers 32, 34 below the upper surface of the plate 14. A pair of throughbores (or grooves) 36, 38 are provided in the base plate 14 and extend from the location of the potentiometer 32, 34 to the outer periphery of the plate 14. The plastic rods 22, 24 are placed in the throughbores (or grooves) 36, 38 and engage the potentiometers 32, 34 thereby providing mechanical access to the potentiometers from the outer edge of the base plate 14. The shielded socket 20 is mounted adjacent to an edge of the base plate 14 and is coupled to the circuit board 18 by a shielded cable thereby providing electrical access to the circuit board 18 from the outer edge of the base plate 14. The baseplate 14 is also provided with four holes 41a–41d located adjacent to one side of the recess 28 for coupling the load cell 15 to the base plate 14 as described in more detail below with reference to FIGS. 3 and 4. According to a presently preferred embodiment, the baseplate 14 is provided with four upstanding corner stops 43a–43d for limiting movement of the bearing plate relative to the base plate as described in more detail below with reference to FIGS. 3 and 4.

According to an exemplary embodiment of the invention, the upper and lower plates are made from aluminum and measure approximately nine inches square by one half inch thick. The load cell 16 is approximately two inches by five inches by approximately one inch at its tallest portion, and has a Z-shaped profile. The recesses 26, 28 are approximately two inches by four inches and one quarter inch deep, and as seen in FIG. 4, are slightly offset from each other. The center portion 16' of the load cell 16 having the bar-bell shaped cut-out 16" is located where the recesses 26, 28 overlap each other. On the other hand, the end portions 16''' and 16'''' of the load cell 16, which are reduced in height by approximately one quarter of an inch, reside in locations where the recesses 26, 28 are not overlapping. Thus, end portion 16''' is located between recess 26 and a non-recessed portion of plate 14, while end portion 16'''' is located between recess 28 and a non-recessed portion of plate 12. The load cell is shown with ramps or tapers 17 between its central and its end portions, although, if desired, the load cell could be notched. Regardless, it is preferred that the load cell be symmetrical.

Figure 3:
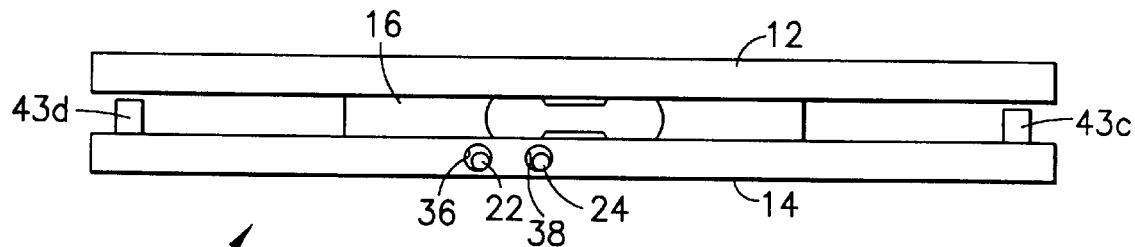
FIG. 3 is a side elevation view of a partially assembled weighing device according to the invention.
Figure 4:
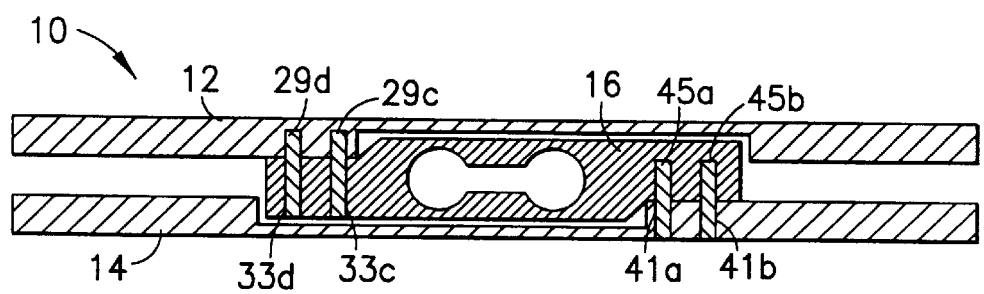
FIG. 4 is a medial sectional view of the partially assembled device.

Turning now to FIGS. 3 and 4, and with reference to FIGS. 1 and 2, the lower base plate 14 is coupled to the load cell 16 by four screws, two of which (45a, 45b) are shown in FIG. 4, which pass through the holes 41a–41d in the base plate 14 and are coupled to the load cell 16 it its reduced-diameter end 16'''. As previously described, the upper plate 12 is coupled to the load cell 16 by four screws, two of which (29c, 29d) are shown in FIG. 4 and are coupled to the load cell 16 at its reduced-diameter end 16''''. When the plates are so coupled to the load cell, the plates 12, 14 assume a substantially parallel alignment as seen best in FIGS. 3 and 4.

Figure 5:
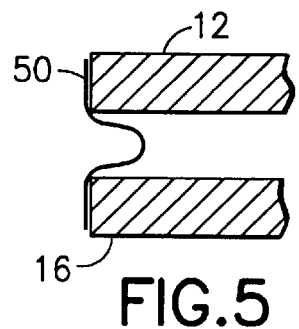
FIG. 5 is sectional view illustrating the rolling band of the invention.

Referring to FIG. 5, and according to a presently preferred aspect of the invention, a metallic cloth tape is applied to the outer edges of the upper and lower plates 12, 14 to form a flexible rolling band 50. This conductive rolling band, together with plates 12 and 14, creates an RF/EM shield around the load cell 16 and the circuit board 18. The band 50 is preferably formed in a non-structurally-supporting configuration such that the band does not inhibit movement of the upper and lower plates 12, 14 relative to each other. A sideways-Ω-shaped configuration is preferred for the band.

Figure 8:
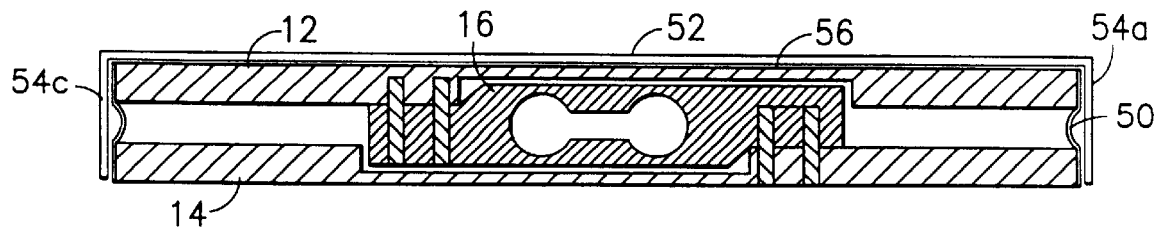
FIG. 8 is a cross-section through line 8—8 in FIG. 7.
Figure 6:
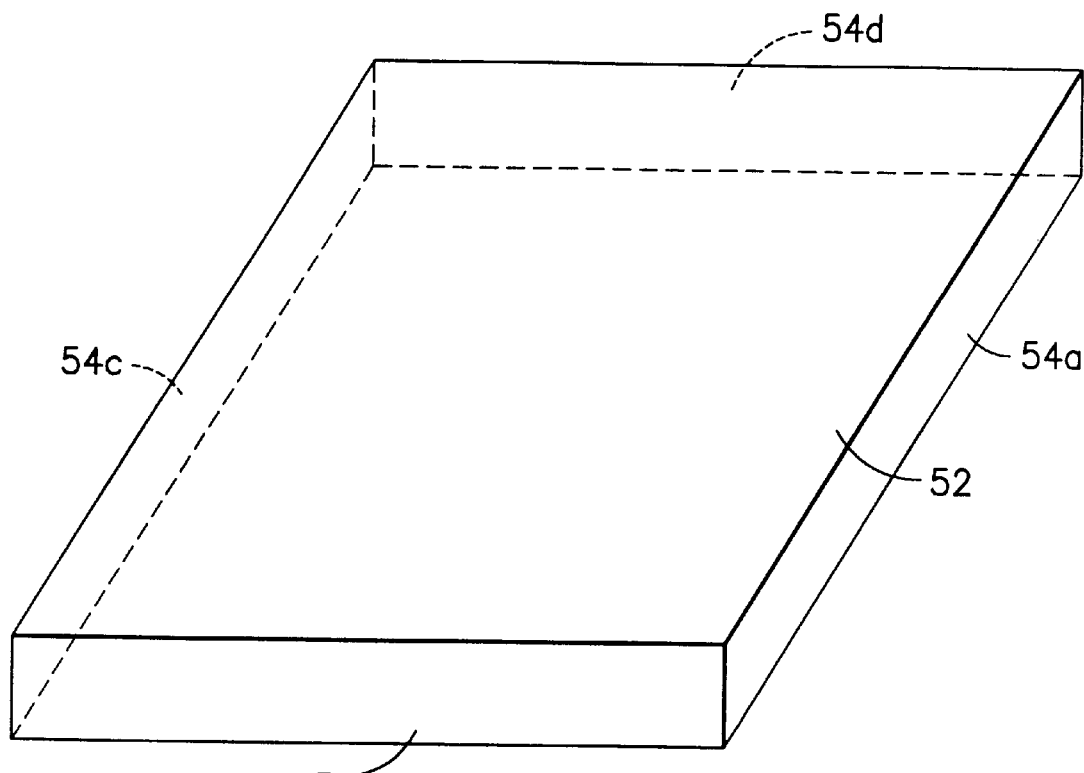
FIG. 6 is a perspective view of the conductive cover of the invention.
Figure 7:
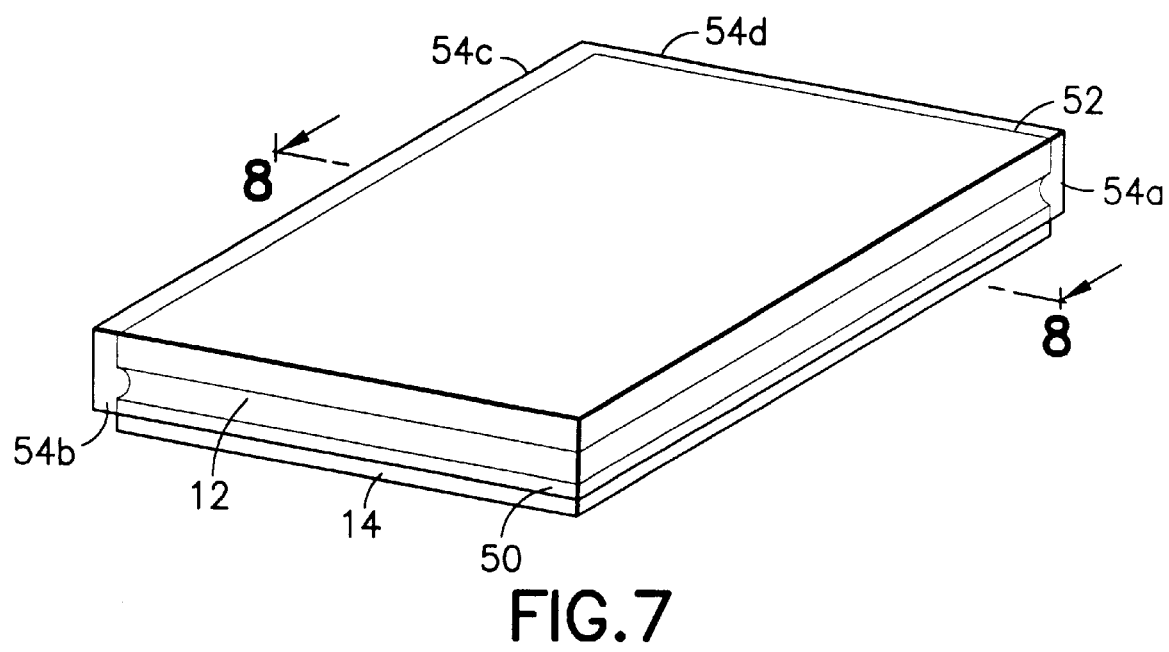
FIG. 7 is a partially transparent perspective view of a fully assembled weighing device according to the invention.

Turning to FIGS. 6 through 8, an electrically conductive cover 52 is preferably attached to the top surface of the top plate 12. Four sides 54a–d of the cover 52 extend down adjacent to the band 50. The cover 52 is preferably electrically coupled to the top plate 12 with an electrically conductive transfer tape 56 or other electrically conductive adhesive, or other means, and forms an additional RF/EM shield around the space between the plates.

There have been described and illustrated herein an electronic weighing apparatus with EMI/RFI shielding. However, it is not intended that the invention be limited to the particular description of the invention, as it is intended that the invention be as broad in scope as the art will allow and that the specification be read likewise. Thus, while particular couplings of the load cell to the upper bearing and lower base plates have been disclosed, it will be appreciated that other couplings could be utilized. Also, while corner stops are shown for limiting movement of the bearing plate relative to the base plate, it will be recognized that other structure may be provided for limiting such movement. Moreover, while a particular Ω-shaped configuration has been disclosed for the band, it will be appreciated that other configurations could be used as well. For example, the band may be S-shaped, pleated or provided with accordion-like folds between the upper and lower plates. Further, while the band was described as being formed from metallic cloth tape, other conductive flexible means could be utilized such as a thin metal or foil, or a synthetic material coated or imbedded with a conductive metal. Furthermore, while a conductive adhesive is preferred for coupling the cover to the bearing plate, it will be understood that another electrical coupling can achieve the same or similar function as disclosed herein, and that the cover, while desirable, is not absolutely necessary for shielding the circuit board and load cell. Also, while certain materials and dimensions are described in the exemplary description, it will be appreciated that other materials and dimensions may be utilized. It will therefore be appreciated by those skilled in the art that yet other modifications could be made to the provided invention without deviating from its spirit and scope as so claimed.

We claim:

1. An electronic weighing device, comprising:
   a) a lower base plate having a first portion of substantially uniform first thickness, and having a recessed portion of a second thickness smaller than said first thickness;
   b) an upper load bearing plate having a first portion of substantially uniform third thickness and having a recessed portion of a fourth thickness smaller than said third thickness, said recessed portion of said upper load bearing plate at least partially overlying said recessed portion of said lower base plate; and
   c) a load cell having a central portion having a first height located between said recessed portion of said lower base plate and said recessed portion of said upper load bearing plate, and having a first end portion having a second height smaller than said first height coupled to said first portion of said lower base plate and a second end portion having a third height smaller than said first height coupled to said first portion of said upper load bearing plate, said load cell adapted to respond to weight on said upper plate.

2. An electronic weighing device according to claim 1, wherein:
   said recessed portion of a second thickness is reduced by at least half said uniform first thickness, and
   said recessed portion of a fourth thickness is reduced by at least half said uniform third thickness.

3. An electronic weighing device according to claim 2, wherein:
   said first thickness is equal to said third thickness, said second thickness is equal to said fourth thickness, and said second height is equal to said third height.

4. An electronic weighing device according to claim 3, wherein:
   said recessed portion of said lower base plate and said recessed portion of said upper load bearing plate are offset from each other,
   said first end portion of said load cell is located between said first portion of said lower base plate and said recessed portion of said upper load bearing plate, and
   said second end portion of said load cell is located between said first portion of said upper load bearing plate and said recessed portion of said lower base plate.

5. An electronic weighing device according to claim 4, wherein:
   said load cell is tapered between said central portion and said first and second end portions.

6. An electronic weighing device according to claim 5, wherein:
   said first height is approximately one inch.

7. An electronic weighing device according to claim 6, wherein:
   said central portion of said load cell defines a bar-bell cutout.

8. An electronic weighing device according to claim 1, wherein:
   said recessed portion of said lower base plate and said recessed portion of said upper load bearing plate are offset from each other,
   said first end portion of said load cell is located between said first portion of said lower base plate and said recessed portion of said upper load bearing plate, and
   said second end portion of said load cell is located between said first portion of said upper load bearing plate and said recessed portion of said lower base plate.

9. An electronic weighing device according to claim 8, wherein:

said load cell is tapered between said central portion and said first and second end portions.

10. An electronic weighing device according to claim 1, wherein:

said load cell is tapered between said central portion and said first and second end portions.

11. An electronic weighing device according to claim 1, wherein:

said first height is approximately one inch.

12. An electronic weighing device according to claim 1, wherein:

said central portion of said load cell defines a bar-bell cutout.

* * * * *